(12) United States Patent
Nakamura et al.

(10) Patent No.: US 8,663,402 B2
(45) Date of Patent: Mar. 4, 2014

(54) SPUTTERING TARGET WITH FEW SURFACE DEFECTS, AND SURFACE PROCESSING METHOD THEREOF

(75) Inventors: Yuichiro Nakamura, Ibaraki (JP); Akira Hisano, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 178 days.

(21) Appl. No.: 13/025,207

(22) Filed: Feb. 11, 2011

(65) Prior Publication Data

US 2011/0132757 A1  Jun. 9, 2011

Related U.S. Application Data

(63) Continuation of application No. 10/598,502, filed as application No. PCT/JP2005/002209 on Feb. 15, 2005, now Pat. No. 7,909,949.

(30) Foreign Application Priority Data

Mar. 1, 2004  (JP) ................................. 2004-055989

(51) Int. Cl.
*C22C 19/07*    (2006.01)

(52) U.S. Cl.
USPC ....... 148/425; 148/557; 148/423; 204/298.13

(58) Field of Classification Search
CPC .................................................. C23C 14/3407
USPC .................................................. 148/557, 425
See application file for complete search history.

(56) References Cited

U.S. PATENT DOCUMENTS

| | | | |
|---|---|---|---|
| 4,895,592 A | 1/1990 | Hatwar et al. | |
| 5,460,793 A | 10/1995 | Kano et al. | |
| 6,024,852 A | 2/2000 | Tamura et al. | |
| 6,153,315 A | 11/2000 | Yamakoshi et al. | |
| 6,521,062 B1 | 2/2003 | Bartholomeusz et al. | |
| 2007/0017803 A1* | 1/2007 | Ziani et al. | ................ 204/298.13 |
| 2007/0125645 A1 | 6/2007 | Nakamura et al. | |
| 2007/0187236 A1 | 8/2007 | Nakamura et al. | |
| 2007/0209547 A1 | 9/2007 | Irumata et al. | |
| 2007/0215463 A1 | 9/2007 | Parkhe et al. | |
| 2009/0229975 A1 | 9/2009 | Yamakoshi | |
| 2010/0089622 A1 | 4/2010 | Irumata et al. | |
| 2010/0320084 A1 | 12/2010 | Sato | |

FOREIGN PATENT DOCUMENTS

| | | |
|---|---|---|
| JP | 03-257158 A | 11/1991 |
| JP | 06-136524 A | 5/1994 |
| JP | 09-228037 A | 9/1997 |
| JP | 11-293454 A | 10/1999 |
| JP | 2000-199054 A | 7/2000 |
| JP | 2002-069623 A | 3/2002 |
| JP | 2002-208125 A | 7/2002 |
| JP | 2003-226954 A | 8/2003 |

\* cited by examiner

*Primary Examiner* — Jessee Roe
*Assistant Examiner* — Christopher Kessler
(74) *Attorney, Agent, or Firm* — Howson & Howson LLP

(57) ABSTRACT

A sputtering target and surface processing method is provided. Intermetallic compounds, oxides, carbides, carbonitrides and other substances without ductility exist in the target surface in a highly ductile matrix phase at a volume ratio of 1 to 50%. The target surface is preliminarily subjected to primary processing of cutting work, and then subsequently subjected to finish processing via polishing. The sputtering target subject to this surface processing has an improved target surface with numerous substances without ductility and prevents or suppresses the generation of nodules and particles upon sputtering.

5 Claims, No Drawings

SPUTTERING TARGET WITH FEW SURFACE DEFECTS, AND SURFACE PROCESSING METHOD THEREOF

CROSS REFERENCE TO RELATED APPLICATIONS

This application is a continuation of U.S. application Ser. No. 10/598,502, now U.S. Pat. No. 7,909,949, which is the National Stage of International Application No. PCT/JP2005/002209, filed Feb. 15, 2005, which claims the benefit under 35 USC 119 of Japanese Application No. 2004-055989, filed Mar. 1, 2004.

BACKGROUND OF THE INVENTION

The present invention relates to a sputtering target with few surface defects such as cracks, indentations, fallouts and the like on the target surface, and to the surface processing method thereof.

The sputtering method is a well-known technique as a means for forming a thin film. The basic principle thereof is to apply voltage between a substrate (anode side) to which the thin film is to be formed and a target (cathode side) facing the substrate at a close distance and which is formed from a thin film forming substance, so as to change argon gas into a plasma. As a result, the argon ion generated thereby collides with the target, which is a cathode material, the energy thereof discharges (knocks out) the target material outside, and the discharged material is laminated on the opposed substrate face.

A thin film forming device employing this sputtering principle includes various modified types such as a bipolar bias sputtering device, high frequency sputtering device and so on, but all of these devices employ the same basic principle.

The material for forming the thin film is referred to as a target, since it becomes the target of the argon ion. Since this target is formed from the collision energy of ion, the thin film forming material constituting the target is laminated on the substrate in an atomic form, or a cluster form formed from an aggregate of such atoms. As a result, a fine and accurate thin film can be formed, and this is the reason it is being widely used in various electronic components today.

Recently, this sputtering used for forming thin films is being demanded of extremely sophisticated deposition methods, and an important task is to form films with few defects.

The generation of such defects in this sputtering is not only attributable to the sputtering method, but is also often caused by the target itself. As such a cause of the generation of defects resulting from the target, there is the production of particles and nodules.

Under normal conditions, the material sputtered (discharged) from the target will adhere to the opposed substrate, but the material is not necessarily sputtered perpendicularly, and is discharged in various directions. This kind of discharged material will adhere to the components inside the sputtering device other than the substrate, and this at some point will peel off, float, and reattach to the substrate.

This kind of material is referred to as particles, and this is not an originally scheduled thin film forming material. Further, since such particles often adhere as a large cluster, for instance, these particles will cause short circuit in the fine wiring film of electronic components, and lead to the generation of defective products. In the generation of such particles, it has been discovered that the generation of particles will increase or decrease depending on the degree of materials discharged from the target; that is, the surface condition of the target.

Further, generally speaking, the target face material is not reduced (eroded) evenly due to the sputtering, and the tendency is for a specific area, a ring shape for example, to be eroded depending on the inherent characteristics of the constituent material and sputtering device, method of applying voltage, among other reasons. Moreover, depending on the type of target material or the manufacturing method of the target, a protrusive substance with numerous bumps known as nodules is formed on the target.

Since this is one of the thin film forming materials, it will not directly affect the thin film. Nevertheless, minute arcs (microarcing) will occur to the protrusions of the nodules, and it has been observed that this results in the increase of particles.

Further, when numerous nodules are generated, the sputtering rate will change (become delayed), and it will not be possible to control the deposition. At times, these rough and large nodules will peel off and adhere to the substrate.

In such a case, the nodules themselves will become a significant obstacle. Thus, it is sometimes necessary to temporarily stop the sputtering process to remove the nodules. This results in a problem of deteriorating the operation efficicency.

Recently, a target is not formed from a uniform material, and is often used in a state where intermetallic compounds, oxides, carbides, carbonitrides and other substances are mixed in a ductile matrix phase. Here, there is a problem in that the generation of nodules and particles will increase.

As conventional technology, disclosed is a sputtering target in which the processing defect layer (fracture layer) containing minute cracks and defective parts arising during the machine work is removed from the surface of a high-melting point metal alloy sputtering target (cf. Japanese Patent Laid-Open Publication No. H3-257158); and a technique for uniformizing the film and suppressing the generation of nodules and particles by adjusting the surface roughness of the sputtering target so as to reduce the amount of residual contamination, hydrogen content on the surface, and thickness of the affected layer (cf. Japanese Patent Laid-Open Publication No. H 11-1766).

Nevertheless, these techniques are not able to resolve the problems encountered in a sputtering target comprising a phase with different fragility.

SUMMARY OF THE INVENTION

Accordingly, an object of the present invention is to provide a sputtering target with few surface defects that is able to improve the target surface in which intermetallic compound, oxide, carbide, carbonitride and other substances without ductility exist in a highly ductile matrix phase, and prevent or suppress the generation of nodules and particles upon sputtering, and to provide the surface processing method thereof.

The present invention provides a sputtering target with few surface defects having a target surface in which intermetallic compounds, oxides, carbides, carbonitrides and other substances without ductility exist in a highly ductile matrix phase at a volume ratio of 1 to 50%, wherein defects of 10 µm or more resulting from machine work do not exist. The intermetallic compounds, oxides, carbides, carbonitrides and other substances without ductility existing in the highly ductile matrix phase can be of a size in which the average particle diameter is at least 0.5 to 50 µm. In addition, the Vickers hardness of the highly ductile matrix phase can be 400 or less, the Vickers hardness of the intermetallic compounds, oxides, carbides, carbonitrides and other substances without ductility can be 400 or more, and the hardness difference therebetween can be at least 1.5 times.

Further, the present invention also provides a surface processing method of a sputtering target with few surface defects, wherein a target surface in which intermetallic compounds, oxides, carbides, carbonitrides and other substances without ductility exist in a highly ductile matrix phase at a volume ratio of 1 to 50% is preliminarily subject to primary processing of cutting work, then subsequently subject to finish processing via polishing. The primary processing of cutting work can be performed to cut an area of 1 mm to 10 mm from the surface of the target material, and the finish processing via polishing can be performed to polish an area of 1 μm to 50 μm from the surface after being subject to the primary processing of cutting work. The polishing can be performed with sandpaper or a grindstone having a rough abrasive grain size of #80 to #400, and the cutting can be performed with lathe processing employing a bite (a cutting tool) or a chip. The intermetallic compounds, oxides, carbides, carbonitrides and other substances without ductility that exist in the highly ductile matrix phase can be of a size in which the average particle diameter is at least 0.5 to 50 μm. The Vickers hardness of the highly ductile matrix phase can be 400 or less, the Vickers hardness of the intermetallic compounds, oxides, carbides, carbonitrides and other substances without ductility can be 400 or more, and the hardness difference therebetween can be at least 1.5 times.

DETAILED DESCRIPTION OF THE INVENTION

The target subject to the surface processing of the present invention is a target in which intermetallic compounds, oxides, carbides, carbonitrides and other substances without ductility are mixed in a highly ductile matrix phase at a volume ratio of 1 to 50%.

When this kind of target material is subject to cutting work with, for example, a turning tool with a bite, the substances without ductility, such as intermetallic compounds, oxides, carbides, carbonitrides and other such brittle substances, serve as locations of origins of surface defects of the highly ductile matrix in the form of cracks, cavities caused by falling out of the brittle substances, or dents with sticking fragments of the brittle substances.

This kind of surface defect often occurs even when the material without ductility having an average particle diameter of 0.5 to 50 μm or more is evenly and finely dispersed. Further, when the hardness thereof is measured, it often seems to be that the Vickers hardness of the highly ductile matrix phase is 400 or less, the Vickers hardness of the intermetallic compounds, oxides, carbides, carbonitrides and other substances without ductility is 400 or more, and the hardness difference is 1.5 times.

Therefore, in such a case, the surface processing method of the present invention is particularly effective.

In the present invention, after performing the primary processing of cutting an area of preferably 1 mm to 10 mm from the target material, the finishing processing via polishing is subsequently performed. The reason for cutting an area of 1 mm to 10 mm is to effectively remove the defects on the target material surface that were previously formed thereon. It is desirable to perform cutting via lathe processing employing a bite (a cutting tool) or a chip.

As a result of this cutting processing (primary processing), although the generation of defects such as cracks and indentations caused by fallouts as described above will occur, such defects are polished with sandpaper or a grindstone having a rough grain size of, for instance, #80 to #400. Thereby, the foregoing defects such as cracks and indentations caused by fallouts are eliminated, and a flat and smooth target face is formed thereby.

Sandpaper or a grindstone having a rough grain size of #80 to #400 is able to effectively eliminate the defects originating from intermetallic compounds, oxides, carbides, carbonitrides and other substances without ductility generated from the cutting work, and is the optimum range of preparing a flat and smooth surface including a ductile matrix phase Here, there is no need to perform mirror polishing, and it will suffice so long as the fallout of cracks and indentations can be removed.

When preparing a flat and smooth target without surface defects such as cracks and indentations caused by fallouts, it is possible to consider polishing the target material from the start with sandpaper or a grindstone having a rough grain size of #80 to #400. Nevertheless, in such a case, there is a problem in that the amount of time required for polishing processing will be enormous, and the maintenance frequency of the grindstone will increase due to the substance of a highly ductile matrix adhering to the grindstone.

In addition, particularly with manual polishing processing, although there may not be a significant difference in the surface roughness, there is a tendency that the outer periphery and center portion are polished more, and there is a problem in that an undulation will occur on the target surface. Therefore, in reality, it is impossible to only perform polishing processing, without performing grinding processing, for the surface processing of the target.

With the sputtering target of the present invention obtained by preliminarily performing primary processing of cutting work to the target surface and thereafter performing finish processing via polishing, as shown in the Examples described below, a significant effect is yielded in that defects of 10 μm or more are eliminated, the surface roughness is improved, and the generation of particles and the generation of nodules after the use of the target can be significantly reduced.

EXAMPLES

Next, the Examples of the present invention are explained. These Examples are merely illustrative, and the present invention shall not in any way be limited by such Examples.

Example 1

In Example 1, Co, Cr, Pt, B were used as the raw material, a target manufactured under the manufacturing conditions including melting, casting and rolling was used, primary processing of cutting with a lathe was performed, and polishing processing with #280 sandpaper was subsequently performed for 10 minutes.

Next, this target was used to form a sputter film on a substrate under an Ar atmosphere of 1.5 Pa and DC sputtering condition of 30 w/cm$^2$.

The defect density of 10 μm or more, average surface roughness, quantity of nodules after use, quantity of particles and surface processing conditions in the foregoing case are shown in Table 1.

Further, the micrographs of the surface condition of the target after being subject to grinding processing, and the surface condition of the target after being subject to polishing processing are shown in FIG. 1 and FIG. 2, respectively. In FIG. 1, defects resulting from numerous cracks and indentations caused by fallouts can be acknowledged. Nevertheless, in FIG. 2 after polishing, no surface defects can be acknowledged.

TABLE 1

|  | Defect Density of 10 μm or More (Defect/cm²) | Average Surface Roughness (μm) | Quantity of Nodules After Use | Quantity of Particles | Surface Processing Method |
|---|---|---|---|---|---|
| Example 1 | 0 | 1.0 | 50 | Few | Processing Method 1 |
| Example 2 | 0 | 0.4 | 45 | Few | Processing Method 1 |
| Comparative Example 1 | 85 | 1.8 | 221 | Many | Processing Method 2 |
| Comparative Example 2 | 50 | 1.6 | 182 | Many | Processing Method 2 |
| Comparative Example 3 | 30 | 0.9 | 170 | Many | Processing Method 2 |
| Comparative Example 4 | 0 | 0.4 | 42 | Few | Processing Method 3 |

Processing Method 1: Cutting processing and polishing processing
Processing Method 2: Cutting processing only
Processing Method 3: Polishing processing only
In Comparative Example 4, the polished surface of the target was undulated.

Example 2

In Example 2, Co, Cr, Pt, B were used as the raw material, and, as with Example 1, a target manufactured under the manufacturing conditions including melting, casting and rolling was used, primary processing of cutting with a lathe was performed, and polishing processing with #400 sandpaper was subsequently performed for 30 minutes.

This target was used to perform sputtering as with Example 1, and the defect density of 10 μm or more, average surface roughness, quantity of nodules after use, quantity of particles were examined. The results Table 1.

Further, the surface condition of the target after being subject to grinding processing, and the surface condition of the target after being subject to polishing processing were observed with a microscope. Defects resulting from numerous cracks and indentations caused by fallouts were acknowledged on the target surface after being subject to grinding processing. Nevertheless, with the target after being subject to polishing, as with Example 1, no surface defects were acknowledged.

Comparative Example 1

In Comparative Example 1, Co, Cr, Pt, B were used as the raw material as with Example 1, a target manufactured under the manufacturing conditions including melting, casting and rolling was used, and primary processing of cutting with a lathe was performed. The amount cut in this case was 0.5 mm Polishing processing was not performed subsequently.

This target was used to perform sputtering as with Example 1, and the defect density of 10 μm or more, average surface roughness, quantity of nodules after use, quantity of particles were examined. The results are similarly shown in Table 1.

Further, the surface condition of the target after being subject to grinding processing was observed with a microscope. Defects resulting from numerous cracks and indentations caused by fallouts were acknowledged on the target surface after being subject to grinding processing, and the defect density of 10 μm or more increased. The number of nodules and particles also increased.

Comparative Example 2

In Comparative Example 2, other than the amount cut being 0.1 mm upon performing primary processing of cutting with a lathe, the conditions used were the same as Comparative Example 1. Polishing processing was not performed.

This target was used to perform sputtering as with Example 1, and the defect density of 10 μm or more, average surface roughness, quantity of nodules after use, quantity of particles were examined. The results are similarly shown in Table 1.

Further, the surface condition of the target after being subject to grinding processing was observed with a microscope. Defects resulting from numerous cracks and indentations caused by fallouts were acknowledged on the target surface after being subject to grinding processing, and the defect density of 10 μm or more increased. As shown in Table 1, the number of nodules and particles also increased.

Comparative Example 3

In Comparative Example 3, other than the amount cut being 0.05 mm upon performing primary processing of cutting with a lathe, the conditions used were the same as Comparative Example 1. Polishing processing was not performed.

This target was used to perform sputtering as with Example 1, and the defect density of 10 μm or more, average surface roughness, quantity of nodules after use, quantity of particles were examined. The results are similarly shown in Table 1.

Further, the surface condition of the target after being subject to grinding processing was observed with a microscope. Defects resulting from numerous cracks and indentations caused by fallouts were acknowledged on the target surface after being subject to grinding processing, and the defect density of 10 μm or more increased.

Since the amount cut was small compared to Comparative Examples 1 and 2, the number of defects was somewhat smaller, but it still showed a similar tendency. As shown in Table 1, the number of nodules and particles also increased.

Comparative Example 4

In Comparative Example 4, Co, Cr, Pt, B were used as the raw material as with Example 1, a target manufactured under the manufacturing conditions including melting, casting and rolling was used, and manual polishing processing was performed from the start to obtain a finish using a grindstone in the order of #80, #150, #280, #400.

Here, there was a problem in that the amount of time required to perform the polishing processing became enormous, and the maintenance frequency of the grindstone increased since the substance of a high ductility matrix adhered to the grindstone.

In addition, with manual polishing processing, although there was no significant difference in the surface roughness, the outer periphery and center portion tended to be polished more, and an undulation occurred on the target surface. The result was a defective target.

As shown in foregoing Examples 1 and 2, the defect density of 10 μm or more resulted in zero defect/cm², and has decreased significantly in comparison to the Comparative Examples. Further, the average surface roughness has also improved in comparison to the Comparative Example. Moreover, it is evident that the generation of nodules and particles after the target is sputtered, which is in particular a problem upon forming thin films, has decreased considerably.

Therefore, it is evident that the surface processing method of the present invention pursuant to cutting work and polishing processing yields a significant effect in the surface processing of a target in which intermetallic compounds, oxides, carbides, carbonitrides and other substances without ductility exist in a highly ductile matrix phase at a volume ratio of 1 to 50%.

Since the present invention yields a superior effect in that it is possible to obtain a target without defects such as cracks, indentations, fallouts or the like by preliminarily subjecting a target surface to the primary processing of cutting work, then subsequently subjecting this to finish processing via polishing, and, as a result of sputtering with this target, the generation of particles and the generation of nodules after the use of the target can be significantly reduced. Thus, the present invention is particularly effective when employed in a target having a target surface in which intermetallic compounds, oxides, carbides, carbonitrides and other substances without ductility exist in a highly ductile matrix phase at a volume ratio of 1 to 50%.

With the present invention, as a result of a target surface in which intermetallic compounds, oxides, carbides, carbonitrides and other substances without ductility exist in a highly ductile matrix phase at a volume ratio of 1 to 50% being preliminarily subject to the primary processing of cutting work, then subsequently subject to finish processing via polishing, a target without defects such as cracks, indentations, fallouts or the like can be obtained. As a result of sputtering with this target, a significant effect is yielded in that defects of 10 μm or more can be substantially eliminated, the surface roughness will improve, and the generation of particles and the generation of nodules after the use of the target can be significantly reduced.

We claim:

1. A sputtering target comprising a target containing at least Co, Cr, Pt and B and having a target surface prepared by melting raw material, casting an ingot from the melted raw material, rolling the ingot to form a rolled blank, cutting a surface layer of a thickness of 1 to 10 mm from the rolled blank to form an exposed cut surface, and polishing the exposed cut surface of the rolled blank with sandpaper or a grindstone having an abrasive grain size of #80 to #400, wherein substances without ductility exist in a highly ductile matrix phase of said sputtering target at a volume ratio of 1 to 50%, surface defects of a size of 10 μm or more originating at locations of the substances without ductility as a result of cutting the rolled blank do not exist in said target surface, and said substances without ductility include intermetallic compounds, oxides, carbides, and carbonitrides, and wherein said substances without ductility have an average diameter of 0.5 to 50 μm, said highly ductile matrix phase has a Vickers hardness of 400 or less, and said substances without ductility have a Vickers hardness of 400 or more and at least 1.5 times the Vickers hardness of said highly ductile matrix phase.

2. A sputtering target, comprising:
  a sputtering target body prepared by melting raw material, casting an ingot from the melted raw material, rolling the ingot to form a rolled blank, cutting a surface layer of a thickness of 1 to 10 mm from the rolled blank to form an exposed cut surface, and polishing the exposed cut surface of the rolled blank with sandpaper or a grindstone having an abrasive grain size of #80 to #400 and containing at least Co, Cr, Pt and B;
  said sputtering target body having a surface including particles of intermetallic compounds, oxides, carbides, and carbonitrides existing and dispersed within a highly ductile matrix phase at a volume ratio of 1 to 50%;
  said particles of intermetallic compounds, oxides, carbides, and carbonitrides having an average particle diameter of at least 0.5 μm;
  said matrix phase having a Vickers hardness of 400 or less, and said particles of intennetallic compounds, oxides, carbides, and carbonitrides having a Vickers hardness of 400 or more, and at least 1.5 times the Vickers hardness of said matrix phase; and
  surface defects of 10 μm or more originating at locations of the particles of intermetallic compounds, oxides, carbides, and carbonitrides in the matrix phase as a result of cutting the rolled blank do not exist on said surface of the sputtering target body and said surface of the sputtering target body provides a flat and smooth target face without undulation.

3. A sputtering target according to claim 2, wherein said average particle diameter of said intermetallic compounds, oxides, carbides, and carbonitrides is 0.5 to 50 μm.

4. A sputtering target according to claim 3, wherein said intermetallic compounds, oxides, carbides, and carbonitrides are less ductile than said matrix phase.

5. A sputtering target according to claim 3, wherein said intermetallic compounds, oxides, carbides, and carbonitrides are brittle and without ductility.

\* \* \* \* \*